(12) United States Patent
Rovedo et al.

(10) Patent No.: US 6,391,703 B1
(45) Date of Patent: May 21, 2002

(54) BURIED STRAP FOR DRAM USING JUNCTION ISOLATION TECHNIQUE

(75) Inventors: Nivo Rovedo, LaGrangeville, NY (US); Chung H. Lam, Williston, VT (US); Rebecca D. Mih, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/894,336

(22) Filed: Jun. 28, 2001

(51) Int. Cl.[7] .......................................... H01L 21/8242
(52) U.S. Cl. ....................................... 438/241; 438/244
(58) Field of Search ................................ 438/210, 241, 438/243, 244, 296, 386, 387

(56) References Cited

U.S. PATENT DOCUMENTS

| | | | | | |
|---|---|---|---|---|---|
| 5,981,332 | A | * | 11/1999 | Mandelman et al. | 438/243 |
| 6,008,104 | A | * | 12/1999 | Schrems | 438/243 |
| 6,063,657 | A | * | 5/2000 | Bronner et al. | 438/244 |
| 6,200,873 | B1 | * | 3/2001 | Schrems et al. | 438/243 |
| 6,294,423 | B1 | * | 9/2001 | Malik et al. | 438/241 |

* cited by examiner

Primary Examiner—Chandra Chaudhari
(74) Attorney, Agent, or Firm—Eric W. Petraske

(57) ABSTRACT

A logic circuit including an embedded DRAM achieves process integration by simultaneously forming the strap connecting the memory cell capacitor with the pass transistor and a buried dielectric layer isolating the logic transistor sources and drains from the substrate.

7 Claims, 5 Drawing Sheets

BURIED STRAP FOR DRAM USING JUNCTION ISOLATION TECHNIQUE

FIELD OF THE INVENTION

The field of the invention is that of logic circuits with embedded DRAM arrays.

BACKGROUND OF THE INVENTION

In the currently active field of integrated circuits having DRAM arrays embedded in a chip that is primarily logic, the art has tried many approaches to reconcile the different process steps for the logic transistors and processes and the DRAM transistors and processes.

Both logic and DRAM have been refined over several generations, with the result that the process steps for the two types of circuits have diverged. Executing all the steps of the two processes in parallel would preserve the refinements of both approaches, but at commercially impractical cost. In the field of embedded DRAMS the current challenge is to devise an integrated process that will lower costs, while still preserving the advantages of logic and DRAM circuits to the maximum extent possible.

SUMMARY OF THE INVENTION

The invention relates to an embedded DRAM process that provides logic transistors with source/drain regions isolated from the substrate for reduced capacitance and simultaneously uses steps in that process to provide a buried strap in the memory array to connect the capacitors in the memory cells with their pass transistors.

DESCRIPTION OF THE PREFERRED EMBODIMENT

Figure 1:
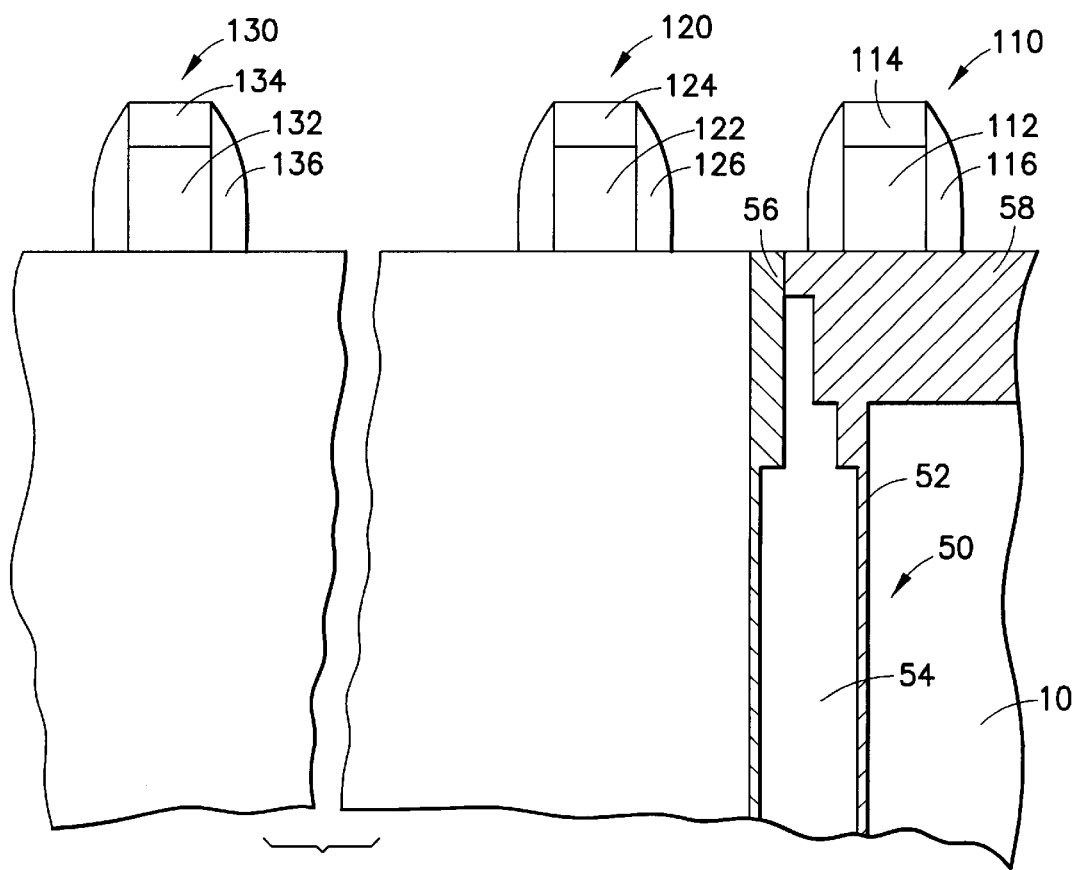
FIGS. 1 through 5 show in cross section a portion of an embedded DRAM array and a logic transistor, at various steps in the process.

FIG. 1 shows in cross section a portion of a logic circuit containing an embedded DRAM array. On the left of the figure, a single transistor, denoted generally with the numeral 130, represents schematically the logic portion of the circuit. On the right, two gate stack structures denoted with the numerals 120 and 110 represent schematically the embedded DRAM portion of the circuit. At this stage, the preliminary work has been completed, referred to as "preparing the substrate" and comprising implants for threshold adjust, well formation, and etching and planarization for shallow trench isolation. Oxide 58 has been deposited and planarized in a preliminary step to define a set of active areas. Either before or after this isolation step, a set of deep trenches has been etched in substrate 10 to form the capacitors 50 of the DRAM cells. The capacitor structure is conventional, with a dielectric 52 (silicon dioxide SiO2 and/or nitride Si3N4) lining the trench and providing insulation for polysilicon center electrode 54 (poly). Between structures 110 and 120, there is a portion of the trench collar oxide denoted with the numeral 56 that will be removed in order to establish a conductive strap between capacitor 50 and pass transistor 120 of the illustrative DRAM cell.

A gate oxide has been grown and structures 110, 120 and 130 formed. The sidewall spacers 116, 126, 136 are formed after any halo, extension and/or LDD implants. Pass transistor 120 has a conventional structure with poly gate 122, nitride cap 124 and nitride sidewalls 126. Corresponding elements of the other structures have the same last digit. Structure 110 is not a transistor in the plane of the Figure, but will form a transistor in the next row behind the plane of the Figure. It is conventionally referred to in the field as a passing wordline, since poly gate 112 also forms a wordline of the DRAM array (as does poly 122).

Figure 2:
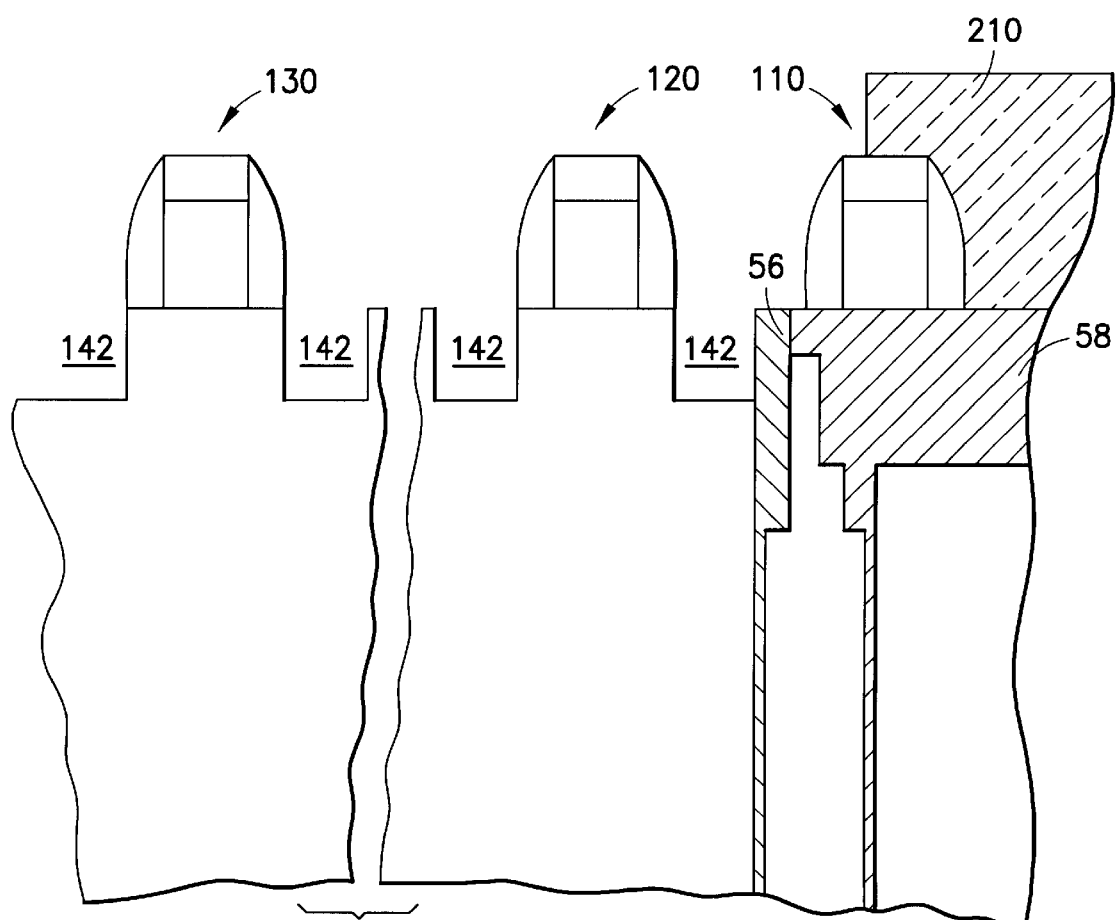

After the gate stack structures have been formed, a resist layer 210 is put down and patterned to define apertures that expose the source and drain areas of the transistors. The entire DRAM array will be exposed. Optionally some of the logic transistors may be covered by resist 210, if desired. A timed etch opens a set of source/drain recesses 142 in the silicon of the substrate. This etch uses conventional HBr/O/He chemistry, etches the Silicon with adequate selectivity to the nitride of the cap and spacers or the oxide of the STI (including oxide 56). The depth of this etch is not critical (nominally 150 nm). The result is shown in FIG. 2, leaving a set of exposed source/drain recesses 142.

Figure 3:
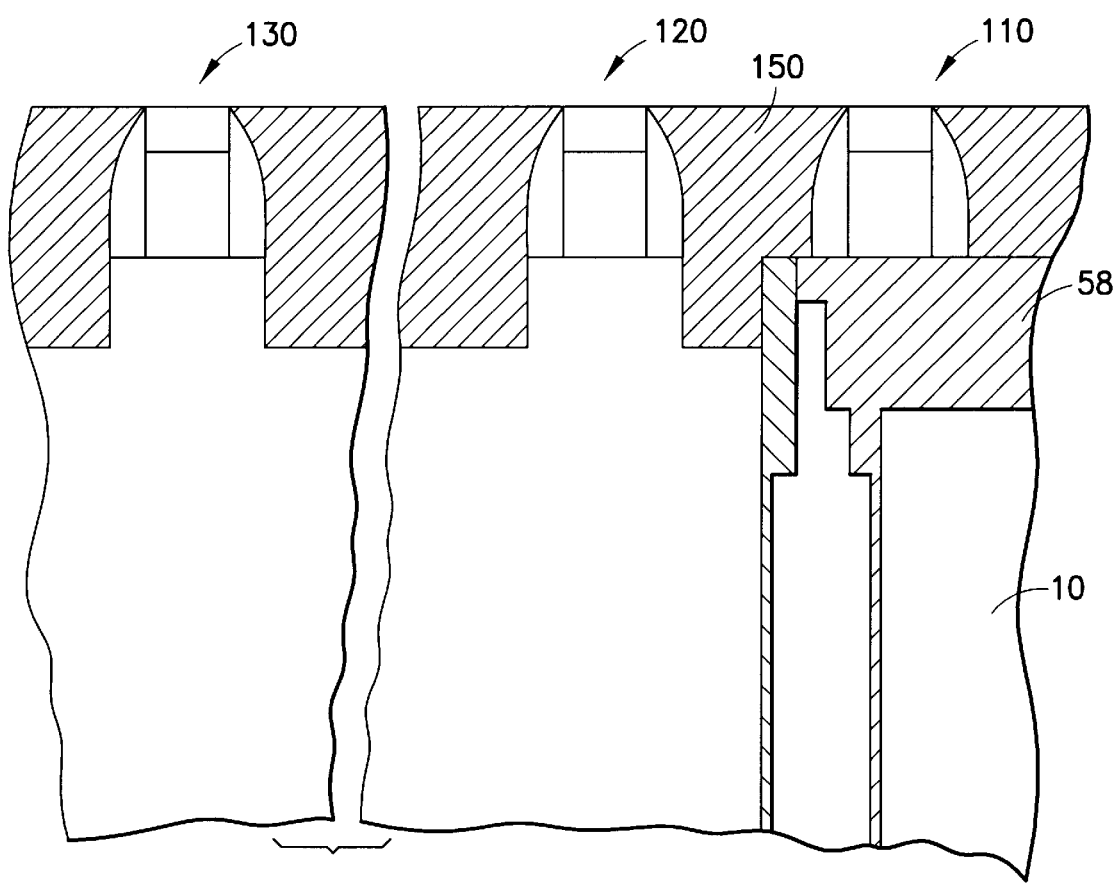

Referring now to FIG. 3, resist 210 has been stripped and a TEOS oxide fill 150 has been deposited in the recesses and up to the tops of the gate stacks, then planarized, using the nitride caps 114, 124, 134 as a polish stop.

Figure 4:
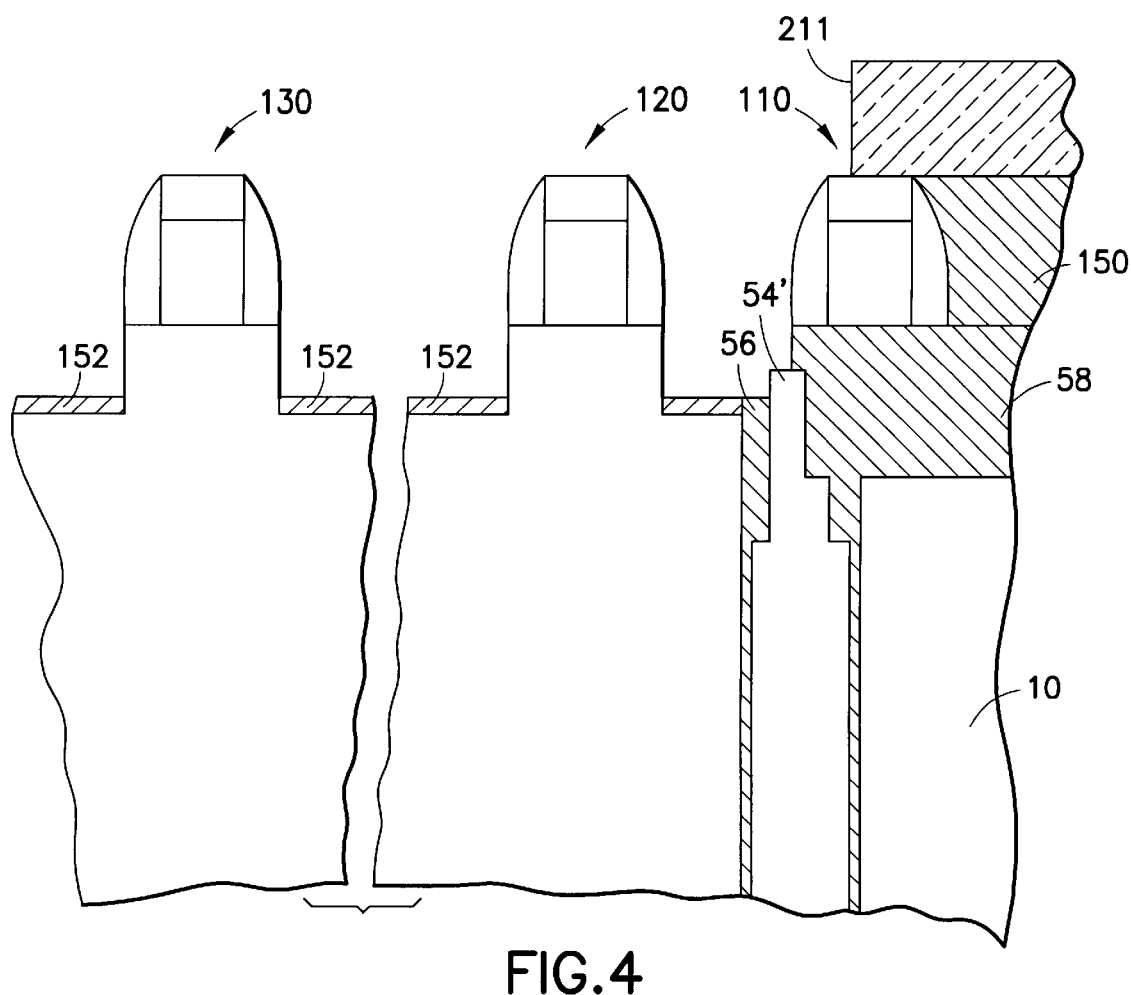

The TEOS is etched away, in turn, through a second mask 211 that protects the STI in the logic portion, leaving a set of TEOS layers 152, referred to as isolation dielectric, in the bottom of the source/drain recesses. A conventional using GF4 or CHF3 chemistry etches the TEOS, leaving the nitride caps and spacers minimally affected. This etch also is non-critical, the only condition being that it expose enough of tip 54' of the capacitor center electrode to make good contact and that it leave enough thickness in the isolation dielectric to suppress capacitance between the source/drain areas and the substrate. Nominally, the remaining thickness of the isolation dielectric is 70 nm. The result is shown in FIG. 4.

Figure 5:
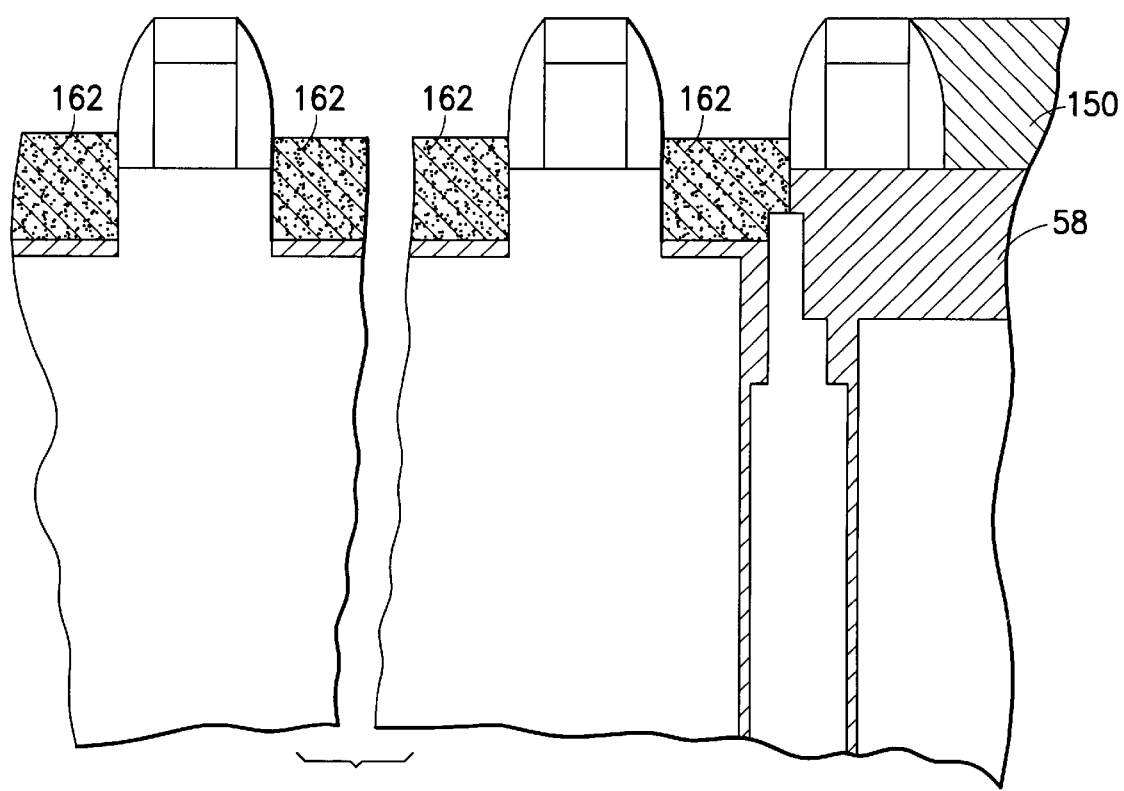

Referring now to FIG. 5, there is shown the result of depositing a layer of conductive material (poly), planarizing it using the caps as a polish stop and then etching the poly down toward the nominal wafer surface. The actual location of the poly surface is not critical. Conventional source/drain implants are performed, which also provide the required conductivity for the poly strap 163 attached to the right side of transistor 120. A remaining portion of oxide 150 protected by mask 211 provides additional isolation above STI 58.

Nitride caps 114, 124, 134 are stripped. If necessary, spacers 116, 126, 136 are re-formed if they are damaged in the cap stripping step. Optionally, silicides can be formed on the exposed silicon (poly) surfaces. It is an advantageous feature of teh invention that the silicide on the buried strap does not contribute to loss of retention time because the junctions are isolated.

Next, a conventional series of back end steps of dielectric deposition and interconnection formation connects the various transistors to complete the circuit.

While the invention has been described in terms of a single preferred embodiment, those skilled in the art will recognize that the invention can be practiced in various versions within the spirit and scope of the following claims.

We claim:

1. A method of forming an integrated circuit on a silicon substrate having a substrate top surface, including a logic portion and an embedded DRAM portion and comprising the steps of:

forming a set of trench capacitors in a set of memory cell locations in said embedded DRAM portion, said set of trench capacitors each having a center electrode and an oxide collar disposed between said center electrode and a pass transistor associated therewith;

forming a set of STI in both said logic portion and said embedded DRAM portion;

simultaneously forming a set of transistor gate stacks on said silicon substrate, including gate oxide, gate electrode and sidewalls, in both said logic portion and said embedded DRAM portion;

simultaneously etching said silicon substrate, selective to dielectric, outside said transistor gate stacks in both said logic portion and said embedded DRAM portion, whereby source/drain locations in said silicon substrate are recessed in a set of source-drain recesses;

simultaneously filling said set of source-drain recesses outside said transistor gate stacks in both said logic portion and said embedded DRAM portion with an isolation dielectric, whereby said set of source-drain recesses in said set of source/drain locations in said silicon substrate are filled with said isolation dielectric;

recessing said isolation dielectric in said set of source-drain recesses such that a residual layer of dielectric remains in said set of source-drain recesses, thereby exposing said center electrode;

depositing and forming a layer of conductive material in said set of source/drain recesses, whereby transistors in said logic portion form sources and drains isolated from said substrate by said residual layer and transistors in said DRAM portion simultaneously form a conductive strap between said transistor body and said center electrode.

2. A method according to claim 1, in which said transistor gate stacks comprise a polysilicon gate covered by a nitride cap and having nitride sidewalls.

3. A method according to claim 2, in which said isolation dielectric is planarized by chemical-mechanical polishing, using said nitride caps as a polish stop, after said step of filling said source/drain recesses and before said step of recessing said isolation dielectric.

4. A method according to claim 1, in which a layer of photoresist protects said STI in at least said logic portion during said step of recessing said isolation dielectric.

5. A method according to claim 1, in which said isolation dielectric is oxide.

6. A method according to claim 2, in which said isolation dielectric is oxide.

7. A method according to claim 3, in which said isolation dielectric is oxide.

\* \* \* \* \*